(12) United States Patent
Maeda et al.

(10) Patent No.: US 11,720,014 B2
(45) Date of Patent: Aug. 8, 2023

(54) MASK BLANK, PHASE SHIFT MASK, AND METHOD OF MANUFACTURING SEMICONDUCTOR DEVICE

(71) Applicant: HOYA CORPORATION, Tokyo (JP)

(72) Inventors: Hitoshi Maeda, Tokyo (JP); Osamu Nozawa, Tokyo (JP); Hiroaki Shishido, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 233 days.

(21) Appl. No.: 17/428,821

(22) PCT Filed: Feb. 6, 2020

(86) PCT No.: PCT/JP2020/004507
§ 371 (c)(1),
(2) Date: Aug. 5, 2021

(87) PCT Pub. No.: WO2020/166475
PCT Pub. Date: Aug. 20, 2020

(65) Prior Publication Data
US 2022/0128898 A1    Apr. 28, 2022

(30) Foreign Application Priority Data
Feb. 13, 2019   (JP) .................. 2019-023891

(51) Int. Cl.
*G03F 1/32* (2012.01)
*H01L 21/033* (2006.01)

(52) U.S. Cl.
CPC ............ *G03F 1/32* (2013.01); *H01L 21/0337* (2013.01)

(58) Field of Classification Search
CPC ..... G03F 1/32; G03F 1/54; G03F 1/80; H01L 21/0337; C23C 14/06
See application file for complete search history.

(56) References Cited

U.S. PATENT DOCUMENTS

| 5,589,305 A | 12/1996 | Tomofuji et al. |
| 5,942,356 A | 8/1999 | Mitsui et al. |

(Continued)

FOREIGN PATENT DOCUMENTS

| JP | H0675361 A | 3/1994 |
| JP | 2966369 B2 | 8/1999 |

(Continued)

OTHER PUBLICATIONS

JP2020-572202, "Notice of Reasons for Refusal" with Machine Translation, dated Nov. 30, 2021, 6 pages.

(Continued)

*Primary Examiner* — Mark F. Huff
*Assistant Examiner* — Moriah S. Smoot
(74) *Attorney, Agent, or Firm* — Kilpatrick Townsend & Stockton LLP (57) ABSTRACT

The phase shift film has a function to transmit an exposure light of a KrF excimer laser at a transmittance of 2% or more, and a function to generate a phase difference of 150 degrees or more and 210 degrees or less between the exposure light transmitted through the phase shift film and the exposure light transmitted through the air for a same distance as a thickness of the phase shift film, in which the phase shift film has a structure where a lower layer and an upper layer are stacked in order from a side of the transparent substrate, in which a refractive index nL of the lower layer at a wavelength of the exposure light and a refractive index nU of the upper layer at a wavelength of the exposure light satisfy a relation of nL>nU, in which an extinction coefficient kL of the lower layer at a wavelength of the exposure light and an extinction coefficient kU of the upper layer at a wavelength of the exposure light satisfy a relation of kL>kU; and in which a thickness dL of the lower layer (Continued)

and a thickness dU of the upper layer satisfy a relation of dL<dU.

19 Claims, 2 Drawing Sheets

(56) References Cited

U.S. PATENT DOCUMENTS

| | | |
|---|---|---|
| 6,569,577 B1 | 5/2003 | Isao et al. |
| 2004/0086788 A1 | 5/2004 | Shiota et al. |
| 2007/0076833 A1 | 4/2007 | Becker et al. |
| 2018/0210331 A1 | 7/2018 | Kajiwara et al. |

FOREIGN PATENT DOCUMENTS

| | | | | |
|---|---|---|---|---|
| JP | 2001201842 A | | 7/2001 | |
| JP | 2003322948 A | | 11/2003 | |
| JP | 2007504497 A | | 3/2007 | |
| JP | 6058757 B1 | | 12/2016 | |
| JP | 2017134424 A | * | 8/2017 | ............... G03F 1/32 |

OTHER PUBLICATIONS

PCT/JP2020/004507, English Translation of International Search Report, dated Apr. 21, 2020, 2 pages.
SG11202108439Y, "Invitation to Respond to Written Opinion", dated Mar. 29, 2023, 9 pages.

* cited by examiner

MASK BLANK, PHASE SHIFT MASK, AND METHOD OF MANUFACTURING SEMICONDUCTOR DEVICE

CROSS-REFERENCE TO RELATED APPLICATIONS

This application is the National Stage of International Application No. PCT/JP2020/004507, filed Feb. 6, 2020, which claims priority to Japanese Patent Application No. 2019-023891, filed Feb. 13, 2019, and the contents of which is incorporated by reference.

TECHNICAL FIELD

This disclosure relates to a mask blank, a phase shift mask manufactured using the mask blank, and a method of its manufacture. This disclosure further relates to a method of manufacturing a semiconductor device using the phase shift mask.

BACKGROUND ART

Generally, in a manufacturing process of a semiconductor device, photolithography is used to form a fine pattern. Multiple substrates called transfer masks are usually utilized in forming the fine pattern. In order to miniaturize a pattern of a semiconductor device, in addition to miniaturization of a mask pattern formed in a transfer mask, it is necessary to shorten a wavelength of an exposure light source used in photolithography. Shortening of wavelength has been advancing recently from the use of a KrF excimer laser (wavelength 248 nm) to an ArF excimer laser (wavelength 193 nm) as an exposure light source in the manufacture of a semiconductor device.

Patent Document 1 discloses a phase shift mask having on a surface of a transparent substrate thereof a light-semitransmissive film formed of a thin film of nitrided molybdenum and silicon (MoSiN-based material). Patent Document 1 further discloses that the light-semitransmissive film has a function to transmit an exposure light of a KrF excimer laser with an intensity that does not substantially contribute to light exposure and a function to shift the light phase of the exposure light that transmitted the light-semitransmissive film.

Patent Document 2 discloses a mask blank with a phase shift film adapted for an exposure light of an ArF excimer laser. This phase shift film has a function to transmit an ArF excimer laser exposure light at a predetermined transmittance and a function to generate a predetermined phase difference to the exposure light that transmitted through the phase shift film. In addition, this phase shift film has a function of increasing a back surface reflectance to an ArF excimer laser exposure light.

PRIOR ART PUBLICATIONS

Patent Documents

[Patent Document 1]
Japan Patent No. 2966369
[Patent Document 2]
Japan Patent No. 6058757

SUMMARY OF THE DISCLOSURE

Problems to be Solved by the Disclosure

A phase shift film of a half tone phase shift mask (hereafter simply referred to as phase shift mask) should have a function to transmit an exposure light at a predetermined transmittance and also a function to generate a predetermined phase difference between the exposure light transmitted through the phase shift film and the exposure light transmitted through the air for a same distance as a thickness of the phase shift film. Recently, further miniaturization of semiconductor devices is in progress, and application of exposure technologies such as multiple patterning techniques is under way. There is increasing demand for precision in stacking each transfer mask of a set of transfer masks used in manufacturing one semiconductor device. Therefore, in the case of a phase shift mask as well, there is a growing demand for preventing thermal expansion of a phase shift film pattern (phase shift pattern) to prevent displacement of the phase shift pattern caused thereby.

In Patent Document 2, a back surface reflectance of a thin film pattern when a phase shift mask is set on an exposure apparatus and irradiated with an ArF excimer laser exposure light from a transparent substrate side (reflectance on the transparent substrate side) is set to be higher than conventional cases. By setting the back surface reflectance higher than conventional cases, heat which generates by conversion of light energy of an exposure light absorbed by a thin film is reduced, and occurrence of position displacement of the thin film pattern associated with thermal expansion of the transparent substrate is suppressed.

A semiconductor device generally has a multilayer structure where a plurality of layers of circuit patterns is stacked on a semiconductor substrate. However, not all layers in the semiconductor device are fine circuit patterns. For example, a layer having a through electrode connecting a fine circuit pattern in a lower layer and a circuit pattern in an upper layer often has a relatively sparse circuit pattern. Further, in a multilayer structure semiconductor device, a fine circuit pattern with small circuit line width is often formed in a lower layer, and a relatively sparse circuit pattern with relatively large circuit line width in an upper layer. To form such a relatively sparse pattern, it is not essential to use an exposure apparatus of an ArF excimer laser exposure light (hereafter ArF exposure light). An exposure apparatus of a KrF excimer laser exposure light (hereafter KrF exposure light) can also be used to form the relatively sparse pattern. In manufacturing a multilayer structure semiconductor device, it is possible to enhance throughput of the semiconductor device manufacture and increase productivity upon mass production by properly using, depending on the density of the circuit pattern of each layer, an exposure apparatus of an ArF exposure light and an exposure apparatus of a KrF exposure light. Further, since light energy of a KrF exposure light is lower than that of an ArF exposure light, a phase shift mask is less affected by a KrF exposure light than an ArF exposure light upon exposure. Therefore, a phase shift mask for a KrF exposure light has longer life than a phase shift mask for an ArF exposure light. For the above reasons, a study is being made to properly use, depending on cases, an exposure apparatus of a KrF exposure light and an exposure apparatus of an ArF exposure light in manufacturing a multilayer structure semiconductor device.

Conventionally, in a semiconductor device manufactured using exposure transfer by a KrF exposure light, all layers in a multilayer structure had relatively sparse circuit patterns (wide circuit line width with wide space between circuit lines). Therefore, relatively low positional precision of circuit patterns between each layer did not cause a problem. However, recent semiconductor devices often have a combination of a layer in which a fine circuit pattern is formed and a layer in which a relatively sparse circuit pattern is formed, as mentioned above. A fine circuit pattern has a narrow circuit line width, and a narrow space between circuit lines. Therefore, in electrically connecting a fine circuit pattern and a relatively sparse circuit pattern, a high positional precision is required also to the relatively sparse circuit pattern to ensure connection with the fine circuit pattern. In the case of a conventional KrF excimer laser phase shift mask, an absorptivity of a KrF exposure light is relatively high and a back surface reflectance is relatively low in a phase shift film. Light energy of the KrF exposure light absorbed by the phase shift film is converted into heat. It was found that the heat of the phase shift film is transferred to a transparent substrate, creating position displacement of the phase shift film pattern, causing a problem of reduction in positional precision.

This disclosure was made to solve the conventional problem. The aspect of the disclosure is to provide a mask blank having a phase shift film on a transparent substrate, the phase shift film having a function to transmit a KrF exposure light at a predetermined transmittance and also a function to generate a predetermined phase difference to the transmitting KrF exposure light, in which the phase shift film can suppress thermal expansion of the phase shift film pattern (phase shift pattern), and can suppress displacement of the phase shift pattern caused thereby. A further aspect is to provide a phase shift mask manufactured using this mask blank. Yet another aspect of this disclosure is to provide a method of manufacturing a semiconductor device using such a phase shift mask.

Means for Solving the Problem

For solving the above problem, this disclosure includes the following configurations.
(Configuration 1)
A mask blank including a phase shift film on a transparent substrate,
in which the phase shift film has a function to transmit an exposure light of a KrF excimer laser at a transmittance of 2% or more, and a function to generate a phase difference of 150 degrees or more and 210 degrees or less between the exposure light transmitted through the phase shift film and the exposure light transmitted through the air for a same distance as a thickness of the phase shift film;
in which the phase shift film has a structure where a lower layer and an upper layer are stacked in order from a side of the transparent substrate;
in which a refractive index $n_L$ of the lower layer at a wavelength of the exposure light and a refractive index $n_U$ of the upper layer at a wavelength of the exposure light satisfy a relation of $n_L > n_U$;
in which an extinction coefficient $k_L$ of the lower layer at a wavelength of the exposure light and an extinction coefficient $k_U$ of the upper layer at a wavelength of the exposure light satisfy a relation of $k_L > k_U$; and
in which a thickness $d_L$ of the lower layer and a thickness $d_U$ of the upper layer satisfy a relation of $d_L < d_U$.
(Configuration 2)
The mask blank according to Configuration 1, in which a refractive index $n_U$ of the upper layer is 2.0 or more.
(Configuration 3)
The mask blank according to Configuration 1 or 2, in which a refractive index $n_L$ of the lower layer is 2.2 or more.
(Configuration 4)
The mask blank according to any of Configurations 1 to 3, in which an extinction coefficient $k_L$ of the lower layer is 1.0 or more.

(Configuration 5)
The mask blank according to any of Configurations 1 to 4, in which a thickness $d_U$ of the upper layer is two times or more than a thickness $d_L$ of the lower layer.
(Configuration 6)
The mask blank according to any of Configurations 1 to 5, in which the phase shift film is formed of a material containing silicon and nitrogen.
(Configuration 7)
The mask blank according to any of Configurations 1 to 6, in which the lower layer is provided in contact with a surface of the transparent substrate.
(Configuration 8)
The mask blank according to any of Configurations 1 to 7, in which a thickness $d_L$ of the lower layer is 40 nm or less.
(Configuration 9)
The mask blank according to any of Configurations 1 to 8 including a light shielding film on the phase shift film.
(Configuration 10)
A phase shift mask including a phase shift film having a transfer pattern on a transparent substrate,
in which the phase shift film has a function to transmit an exposure light of a KrF excimer laser at a transmittance of 2% or more, and a function to generate a phase difference of 150 degrees or more and 210 degrees or less between the exposure light transmitted through the phase shift film and the exposure light transmitted through the air for a same distance as a thickness of the phase shift film;
in which the phase shift film has a structure where a lower layer and an upper layer are stacked in order from a side of the transparent substrate;
in which a refractive index $n_L$ of the lower layer at a wavelength of the exposure light and a refractive index $n_U$ of the upper layer at a wavelength of the exposure light satisfy a relation of $n_L > n_U$;
in which an extinction coefficient $k_L$ of the lower layer at a wavelength of the exposure light and an extinction coefficient $k_U$ of the upper layer at a wavelength of the exposure light satisfy a relation of $k_L > k_U$; and
in which a thickness $d_L$ of the lower layer and a thickness $d_U$ of the upper layer satisfy a relation of $d_L < d_U$.
(Configuration 11)
The phase shift mask according to Configuration 10, in which a refractive index $n_U$ of the upper layer is 2.0 or more.
(Configuration 12)
The phase shift mask according to Configuration 10 or 11, in which a refractive index $n_L$ of the lower layer is 2.2 or more.
(Configuration 13)
The phase shift mask according to any of Configurations 10 to 12, in which an extinction coefficient $k_L$ of the lower layer is 1.0 or more.
(Configuration 14)
The phase shift mask according to any of Configurations 10 to 13, in which a thickness $d_U$ of the upper layer is two times or more than a thickness $d_L$ of the lower layer.
(Configuration 15)
The phase shift mask according to any of Configurations 10 to 14, in which the phase shift film is formed of a material containing silicon and nitrogen.
(Configuration 16)
The phase shift mask according to any of Configurations 10 to 15, in which the lower layer is provided in contact with a surface of the transparent substrate.

(Configuration 17)

The phase shift mask according to any of Configurations 10 to 16, in which a thickness $d_L$ of the lower layer is 40 nm or less.

(Configuration 18)

The phase shift mask according to any of Configurations 10 to 17 including a light shielding film having a pattern including a light shielding band on the phase shift film.

(Configuration 19)

A method of manufacturing a phase shift mask using the mask blank according to Configuration 9, including the steps of:

forming a transfer pattern in the light shielding film by dry etching;

forming a transfer pattern in the phase shift film by dry etching with a light shielding film having the transfer pattern as a mask; and forming a pattern including a light shielding band in the light shielding film by dry etching with a resist film having a pattern including a light shielding band as a mask.

(Configuration 20)

A method of manufacturing a semiconductor device including the step of using the phase shift mask according to Configuration 18 and subjecting a resist film on a semiconductor substrate to exposure transfer of a transfer pattern.

(Configuration 21)

A method of manufacturing a semiconductor device including the step of using the phase shift mask manufactured by the method of manufacturing the phase shift mask according to Configuration 19 and subjecting a resist film on a semiconductor substrate to exposure transfer of a transfer pattern.

Effect of the Disclosure

The mask blank of this disclosure includes a phase shift film on a transparent substrate, the phase shift film having a function to transmit a KrF exposure light at a predetermined transmittance and also a function to generate a predetermined phase difference to the transmitting KrF exposure light, in which the phase shift film can suppress thermal expansion of the phase shift film pattern (phase shift pattern) and can suppress displacement of the phase shift pattern caused thereby.

EMBODIMENTS FOR CARRYING OUT THE DISCLOSURE

The embodiments of this disclosure are described below.

The inventors diligently studied a mask blank for manufacturing a phase shift mask on the configuration necessary for the phase shift mask of the mask blank to have a function to transmit a KrF exposure light at a predetermined transmittance (2% or more) and also a function to generate a predetermined phase difference (150 degrees or more and 210 degrees or less) to the transmitting KrF exposure light, the phase shift film suppressing thermal expansion of the phase shift film pattern (phase shift pattern) and suppressing displacement of the phase shift pattern caused thereby.

On the viewpoint of suppressing thermal expansion of a phase shift pattern and displacement of the pattern, it is important to increase a reflectance on a transparent substrate side (back surface side) to a KrF exposure light (back surface reflectance). To increase a back surface reflectance of a thin film provided on a transparent substrate, it is necessary to form at least a layer of a thin film at a transparent substrate side from a material having a high extinction coefficient k at an exposure light wavelength. Due to the necessity to fulfill desired optical properties and film thickness, a phase shift film of a single layer structure is commonly formed of a material with a high refractive index n and a low extinction coefficient k. Consideration is made herein on increasing a back surface reflectance of a phase shift film by significantly increasing an extinction coefficient k by adjusting the composition of a material forming a phase shift film. Since the adjustment precludes the phase shift film from satisfying the condition of a transmittance of a predetermined range, it will be necessary to significantly reduce the thickness of the phase shift film. On the other hand, however, reduction of thickness of the phase shift film will preclude the phase shift film from satisfying the condition of the phase difference of a predetermined range. Since there is a limitation in increasing a refractive index n of a material forming a phase shift film, it is difficult to increase a back surface reflectance with a phase shift film of a single layer.

On the other hand, in providing a multilayer structure reflective film at a transparent substrate side of a phase shift film to increase a back surface reflectance, there are problems of significant increase in total thickness of the phase shift film and difficulty in adjustment to satisfy the conditions of a predetermined range of transmittance and phase difference. The inventors further studied a design idea of a phase shift film having a stacked structure including a lower layer and an upper layer, and increasing a back surface reflectance of the entirety of the stacked structure.

To increase a back surface reflectance of a phase shift film of a stacked structure including a lower layer and an upper layer than a single layer structure phase shift film, it is necessary that the lower layer at a transparent substrate side has more extinction coefficient k than an extinction coefficient k of the upper layer. This point is similar in both a phase shift film for an ArF exposure light and a phase shift film for a KrF exposure light. Conventionally, a material containing silicon is often used in a phase shift film. In the case of a phase shift film for an ArF exposure light, as nitrogen content increases, a refractive index n of an ArF exposure light tends to increase and an extinction coefficient k of an ArF exposure light tends to decrease. Therefore, when a material having a large ArF exposure light extinction coefficient k is selected as a lower layer, an ArF exposure light refractive index n of the lower layer naturally decreases.

A phase shift film should have a function to generate a predetermined phase difference between an exposure light transmitted through the phase shift film and the exposure light transmitted through the air for a same distance as a thickness of the phase shift film. Further, the phase shift film preferably has less thickness. Therefore, it is preferable to select a material with a high ArF exposure light refractive index n as an upper layer of a phase shift film for an ArF exposure light. Considering the above matters, in the case of a phase shift film for an ArF exposure light, a preferable configuration is that a ArF exposure light refractive index n of a lower layer is less than an ArF exposure light refractive index n of an upper layer, and an ArF exposure light extinction coefficient k of a lower layer is greater than an ArF exposure light extinction coefficient k of an upper layer. A phase shift film having the above configuration reflects a part of an ArF exposure light at an interface between a transparent substrate and a lower layer having a large ArF exposure light extinction coefficient k. In addition, a part of an ArF exposure light entered in the lower layer is further reflected at an interface between a lower layer and an upper layer having large difference in an ArF exposure light refractive index n. For the above reason, it is possible to increase a back surface reflectance to an ArF exposure light of a phase shift film than a single layer structure phase shift film.

On the other hand, the circumstance of a phase shift film for a KrF exposure light differs from a phase shift film for an ArF exposure light. In the case of a phase shift film for a KrF exposure light, as nitrogen content increases, an extinction coefficient k of a KrF exposure light tends to decrease, similar to the case of a phase shift film for an ArF exposure light. However, it was found that in the case of a phase shift film for a KrF exposure light, while a refractive index n of a KrF exposure light increases at the stage where a nitrogen content increases from zero to a predetermined amount, when increase in nitrogen content exceeds a predetermined amount, a refractive index n of a KrF exposure light tends to decrease although tends to increase compared to those without nitrogen. This point significantly differs from a phase shift film for an ArF exposure light. In the case of a phase shift film for a KrF exposure light as well, it is necessary to use a material with a high KrF exposure light extinction coefficient k for a lower layer and a material with a low KrF exposure light extinction coefficient k for an upper layer. However, refractive indexes n of a KrF exposure light in a lower layer and an upper layer may be the same depending on a nitrogen content of the lower layer and the upper layer. Further, due to the relationship of a nitrogen content and a refractive index n of a KrF exposure light as mentioned above, design of freedom is relatively low in allowing a KrF exposure light refractive index n of an upper layer to be greater than a KrF exposure light refractive index n of a lower layer.

Considering the above elements, in the case of a phase shift film for a KrF exposure light, a preferable configuration is that a KrF exposure light refractive index n of a lower layer is greater than a KrF exposure light refractive index n of an upper layer, and a KrF exposure light extinction coefficient k of a lower layer is greater than a KrF exposure light extinction coefficient k of an upper layer. A phase shift film having the above configuration reflects a part of a KrF exposure light at an interface between a transparent substrate and a lower layer having a large KrF exposure light extinction coefficient k. In addition, a part of an ArF exposure light entered in the lower layer is further reflected at an interface between a lower layer and an upper layer having a difference in a KrF exposure light refractive index n. Thus, it is possible to allow a back surface reflectance of a phase shift film to a KrF exposure light to be higher than a phase shift film of a single layer structure. Further, to provide a phase shift film having a lower layer and an upper layer as mentioned above with two basic functions required for the phase shift film (functions of a predetermined transmittance and a predetermined phase difference to a KrF exposure light), a thickness of the upper layer with a low KrF exposure light extinction coefficient is preferably thicker than a thickness of the lower layer with a high KrF exposure light extinction coefficient. It was concluded that the above technical problem can be solved by the configuration of the phase shift film as stated above.

Namely, the mask blank of this disclosure is a mask blank having a phase shift film on a transparent substrate, in which the phase shift film has a function to transmit an exposure light of a KrF excimer laser at a transmittance of 2% or more, and a function to generate a phase difference of 150 degrees or more and 210 degrees or less between the exposure light transmitted through the phase shift film and the exposure light transmitted through the air for a same distance as a thickness of the phase shift film, in which the phase shift film has a structure where a lower layer and an upper layer are stacked in order from a side of the transparent substrate, in which a refractive index $n_L$ of the lower layer at a wavelength of the exposure light and a refractive index $n_U$ of the upper layer at a wavelength of the exposure light satisfy a relation of $n_L > n_U$, in which an extinction coefficient $k_L$ of the lower layer at a wavelength of the exposure light and an extinction coefficient $k_U$ of the upper layer at a wavelength of the exposure light satisfy a relation of $k_L > k_U$; and in which a thickness $d_L$ of the lower layer and a thickness $d_U$ of the upper layer satisfy a relation of $d_L < d_U$.

Figure 1:
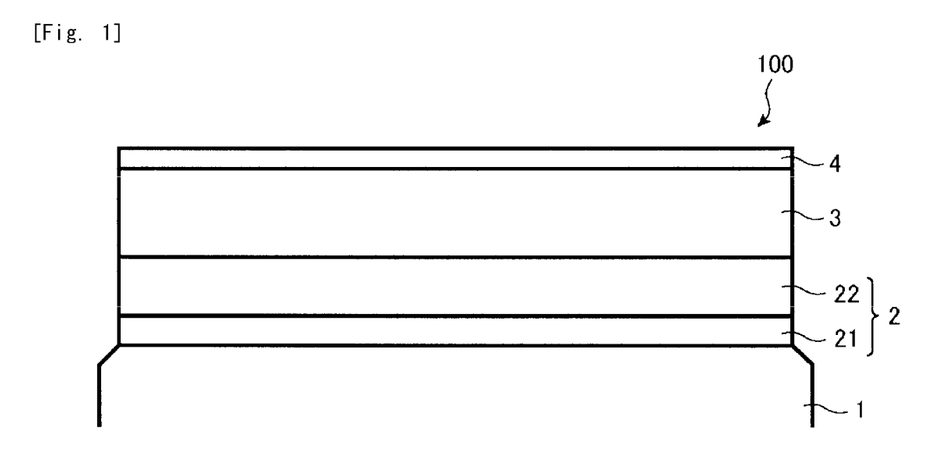
FIG. 1 is a cross-sectional view showing a configuration of the mask blank of the embodiment of this disclosure.

FIG. 1 is a cross-sectional view showing a configuration of a mask blank 100 of an embodiment of this disclosure. The mask blank 100 of this disclosure shown in FIG. 1 has a structure where a phase shift film 2, a light shielding film 3, and a hard mask film 4 are stacked in this order on a transparent substrate 1.

The transparent substrate 1 can be made of quartz glass, aluminosilicate glass, soda-lime glass, low thermal expansion glass ($SiO_2$—$TiO_2$ glass, etc.), etc., in addition to synthetic quartz glass. Among the above, synthetic quartz glass is particularly preferable as a material for forming the transparent substrate 1 of the mask blank for having a high transmittance to a KrF excimer laser light. A refractive index n of the material forming the transparent substrate 1 to a KrF exposure light wavelength (about 248 nm) is preferably 1.44 or more and 1.58 or less, more preferably 1.46 or more and 1.56 or less, and even more preferably 1.48 or more and 1.54 or less. Hereinafter, a refractive index n to a KrF exposure light wavelength is simply referred to as a refractive index n, and an extinction coefficient k to a KrF exposure light wavelength is simply referred to as an extinction coefficient k (the same applies to n and k with a subscript).

It is required for the phase shift film 2 to have a transmittance to a KrF exposure light of 2% or more and 40% or less. To generate a sufficient phase shift effect between the exposure light transmitted through the interior of the phase shift film 2 and the exposure light transmitted through the air, at least 2% transmittance to an exposure light is necessary. A transmittance of the phase shift film 2 to an exposure light is preferably 3% or more, and more preferably 4% or more. On the other hand, as a transmittance of the phase shift film 2 to an exposure light increases, it will be more difficult to increase a back surface reflectance. Therefore, a transmittance of the phase shift film 2 to an exposure light is preferably 40% or less, more preferably 35% or less, and even more preferably 30% or less.

To obtain a proper phase shift effect, it is desired for the phase shift film 2 to be adjusted such that a phase difference that generates between the transmitting KrF exposure light and the light that transmitted through the air for the same distance as a thickness of the phase shift film 2 is within the range of 150 degrees or more and 210 degrees or less. The phase difference of the phase shift film 2 is preferably 155 degrees or more, and more preferably 160 degrees or more. On the other hand, the phase difference of the phase shift film 2 is preferably 200 degrees or less, and more preferably 190 degrees or less. This is for the purpose of reducing an influence of increase in phase difference caused by microscopic etching of the transparent substrate 1 upon dry etching in forming a pattern in the phase shift film 2.

On the viewpoint of suppressing thermal expansion of a pattern formed in the phase shift film 2 and displacement of the pattern, it is preferable that the phase shift film 2 has 20% or more reflectance on the transparent substrate 1 side (back surface side) to a KrF exposure light (back surface reflectance). A back surface reflectance of the phase shift film 2 to a KrF exposure light is preferably 25% or more. On the other hand, a back surface reflectance of the phase shift film 2 being too high is not preferable, since greater influence will be imparted on an exposure transfer image by a reflected light of the back surface side of the phase shift film 2 when the phase shift mask 200 manufactured from this mask blank 100 was used to exposure-transfer an object to be transferred (resist film on semiconductor wafer, etc.). On this viewpoint, a back surface reflectance of the phase shift film 2 to a KrF exposure light is preferably 45% or less, and more preferably 40% or less.

The phase shift film 2 has a structure where a lower layer 21 and an upper layer 22 are stacked from the transparent substrate side. It is required to at least satisfy each condition of transmittance, phase difference, and back surface reflectance given above in the entirety of the phase shift film 2. For the phase shift film 2 to satisfy these conditions, it is necessary that a refractive index $n_L$ of the lower layer 21 and a refractive index $n_U$ of the upper layer 22 satisfy a relation of $n_L > n_U$, an extinction coefficient $k_L$ of the lower layer 21 and an extinction coefficient $k_U$ of the upper layer 22 satisfy a relation of $k_L > k_U$, and a thickness $d_L$ of the lower layer 21 and a thickness $d_U$ of the upper layer 22 satisfy a relationship of $d_L < d_U$.

A refractive index $n_L$ of the lower layer 21 of the phase shift film 2 is preferably 2.2 or more. A refractive index $n_L$ of the lower layer 21 is preferably 2.3 or more, and more preferably 2.35 or more. Further, a refractive index $n_L$ of the lower layer 21 is preferably 3.0 or less, and more preferably 2.9 or less. An extinction coefficient $k_L$ of the lower layer 21 is preferably 1.0 or more. An extinction coefficient $k_L$ of the lower layer 21 is preferably 1.2 or more, and more preferably 1.4 or more. Further, an extinction coefficient $k_L$ of the lower layer 21 is preferably 3.8 or less, and more preferably 3.6 or less.

On the other hand, to satisfy the relations of the lower layer 21 and the upper layer 22 of the phase shift film 2, a refractive index $n_U$ of the upper layer 22 is preferably 2.0 or more. A refractive index $n_U$ of the upper layer 22 is more preferably 2.1 or more, and even more preferably 2.2 or more. Further, a refractive index $n_U$ of the upper layer 22 is preferably 2.8 or less, and more preferably 2.6 or less. An extinction coefficient $k_U$ of the upper layer 22 is preferably 0.01 or more, and more preferably 0.02 or more. Further, an extinction coefficient $k_U$ of the upper layer 22 is preferably 0.8 or less, and more preferably 0.6 or less.

A difference between a refractive index $n_L$ of the lower layer 21 and a refractive index $n_U$ of the upper layer 22 is preferably 0.05 or more on the viewpoint of enhancing a back surface reflectance. Further, a difference between a refractive index $n_L$ of the lower layer 21 and a refractive index $n_U$ of the upper layer 22 is preferably 1.0 or less, and more preferably 0.5 or less. A refractive index n of a thin film to a KrF exposure light has less variation caused by adjustment of the composition and film forming method of the thin film compared to a refractive index n of an ArF exposure light. Therefore, etching properties and durability of the lower layer 21 and the upper layer 22 may reduce when a difference between a refractive index $n_L$ of the lower layer 21 and a refractive index $n_U$ of the upper layer 22 is significantly greater than 1.0.

A difference between an extinction coefficient $k_L$ of the lower layer 21 and an extinction coefficient $k_U$ of the upper layer 22 is preferably 1.0 or more, and more preferably 1.2 or more. Since it is difficult to significantly increase a difference between a refractive index $n_L$ of the lower layer 21 and a refractive index $n_U$ of the upper layer 22 for the above reason, it is preferable to enhance a back surface reflectance by making a difference between an extinction coefficient $k_L$ of the lower layer 21 and an extinction coefficient $k_U$ of the upper layer 22 be 1.0, and preferably more than 1.2. A difference between an extinction coefficient $k_L$ of the lower layer 21 and an extinction coefficient $k_U$ of the upper layer 22 is preferably 2.5 or less, and more preferably 2.3 or less. An extinction coefficient k of a thin film to a KrF exposure light is less than an extinction coefficient k to an ArF exposure light. To significantly increase a difference between an extinction coefficient $k_L$ of the lower layer 21 and an extinction coefficient $k_U$ of the upper layer 22 more than 2.5, it is necessary to significantly decrease an extinction coefficient $k_U$ of the upper layer 22, since there is a limitation in increasing an extinction coefficient $k_L$ of the lower layer 21. In this case, it is necessary to significantly increase the overall film thickness of the phase shift film 2.

A refractive index n and an extinction coefficient k of a thin film including the phase shift film 2 are not determined only by the composition of the thin film. Film density and crystal condition of the thin film are also the factors that affect a refractive index n and an extinction coefficient k. Therefore, the conditions in forming a thin film by reactive sputtering are adjusted so that the thin film reaches desired refractive index n and extinction coefficient k. For allowing the lower layer 21 and the upper layer 22 to have a refractive index n and an extinction coefficient k of the above range, not only the ratio of mixed gas of noble gas and reactive gas (oxygen gas, nitrogen gas, etc.) is adjusted in forming a film by reactive sputtering, but various other adjustments are made upon forming a film by reactive sputtering, such as pressure in a film forming chamber, power applied to the sputtering target, and positional relationship such as distance between the target and the transparent substrate 1. Further, these film forming conditions are specific to film forming apparatuses, and are adjusted arbitrarily for the lower layer 21 and the upper layer 22 to be formed to achieve desired refractive index n and extinction coefficient k.

A thickness of the phase shift film 2 is preferably 120 nm or less. On the other hand, it is necessary to satisfy the relation of a thickness $d_L$ of the lower layer 21 and a thickness $d_U$ of the upper layer 22 of the phase shift film 2. Particularly considering a transmittance of the entirety of the phase shift film 2 to a KrF exposure light, a thickness $d_L$ of the lower layer 21 is preferably 40 nm or less, more preferably 35 nm or less, and even more preferably 30 nm or less. Particularly considering a back surface reflectance of the phase shift film 2, a thickness $d_L$ of the lower layer 21 is preferably 3 nm or more, more preferably 5 nm or more, and even more preferably 7 nm or more.

Particularly considering a phase difference and a back surface reflectance of the entirety of the phase shift film 2 of a KrF exposure light, a thickness $d_U$ of the upper layer 22 is preferably two times or more than a thickness $d_L$ of the lower layer 21, and more preferably 2.2 times or more. Further, particularly considering that a thickness of the phase shift film 2 is 120 nm or less, a thickness $d_U$ of the upper layer 22 is preferably 15 times or less than a thickness $d_L$ of the lower layer 21, and more preferably 12 times or less. A thickness $d_U$ of the upper layer 22 is preferably 110 nm or less, and more preferably 100 nm or less.

The phase shift film 2 is preferably formed of a material containing silicon and nitrogen. Further, the phase shift film 2 can be formed of a material further containing a metallic element in addition to silicon and nitrogen. A metal element to be included in the material forming the phase shift film 2 is preferably a transition metal element. The transition metal elements in this case can include one or more metal elements among molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), zinc (Zn), niobium (Nb), and palladium (Pd). Metal element other than the transition metal elements to be included in the material forming the phase shift film 2 includes aluminum (Al), indium (In), tin (Sn), gallium (Ga), etc. In addition to the elements above, the material forming the phase shift film 2 can include elements such as carbon (C), hydrogen (H), boron (B), germanium (Ge), and antimony (Sb). The material forming the phase shift film 2 can include inert gas such as helium (He), argon (Ar), krypton (Kr), and xenon (Xe).

On the other hand, the phase shift film 2 can be formed of a material consisting of silicon and nitrogen, or a material consisting of nitrogen, silicon, and one or more elements selected from a non-metallic element and a metalloid element. In this case, the phase shift film 2 can contain any metalloid elements in addition to silicon. Among these metalloid elements, it is preferable to include one or more elements selected from boron, germanium, antimony, and tellurium, since enhancement in conductivity of silicon to be used as a sputtering target can be expected.

The phase shift film 2 can include any non-metallic elements in addition to nitrogen. The non-metallic elements herein refer to those including non-metallic elements in a narrow sense (nitrogen, carbon, oxygen, phosphorus, sulfur, selenium), halogen, and noble gas. Among these non-metallic elements, it is preferable to include one or more elements selected from carbon, fluorine, and hydrogen. An oxygen content of the phase shift film 2 is preferably 10 atom % or less, more preferably 5 atom % or less, and further preferable not to positively include oxygen (lower detection limit or less when composition analysis was conducted by X-ray photoelectron spectroscopy, etc.).

Further, as mentioned above, it is necessary that a refractive index $n_L$ of the lower layer 21 and a refractive index $n_U$ of the upper layer 22 satisfy a relation of $n_L > n_U$ and an extinction coefficient $k_L$ of the lower layer 21 and an extinction coefficient $k_U$ of the upper layer 22 satisfy a relation of $k_L > k_U$.

The lower layer 21 of the phase shift film 2 is preferably formed of a material substantially free of oxygen. This is because degree of reduction of an extinction coefficient $k_L$ due to an increase of oxygen content in the material is significant, which is not preferable to satisfy the above relations. The material substantially free of oxygen herein is a material with an oxygen content of at least 5 atom % or less. An oxygen content of the material forming the lower layer 21 of the phase shift film 2 is preferably 3 atom % or less, and more preferably equal to or less than detection lower limit when composition analysis was made through X-ray photoelectron spectroscopy, etc.

Further, the upper layer 22 can have a layer with more oxygen content on its surface layer than a portion of the upper layer 22 excluding the surface layer (hereafter simply referred to as surface oxidization layer). A thickness of the surface oxidization layer of the upper layer 22 is preferably 5 nm or less, and more preferably 3 nm or less. A refractive index $n_U$ and an extinction coefficient $k_U$ of the upper layer 22 are average values of the entirety of the upper layer 22 including the surface oxidization layer. Since a ratio of the surface oxidization layer in the upper layer 22 is extremely small, the presence of the surface oxidization layer slightly affects a refractive index $n_U$ and an extinction coefficient $k_U$ of the overall upper layer 22.

Further, a material forming the phase shift film 2 preferably contains nitrogen. When nitrogen is included in a material forming the phase shift film 2, a refractive index n tends to relatively increase, and an extinction coefficient k tends to relatively decrease compared to the case where the material is free of nitrogen. A material forming the upper layer 22 preferably has more nitrogen content than a material forming the lower layer 21. A nitrogen content of the lower layer 21 is preferably 30 atom % or less, and more preferably 25 atom % or less. On the other hand, a nitrogen content of the upper layer 22 (average of the entirety of the upper layer 22 including the surface oxidization layer) is preferably more than 30 atom %, and more preferably 35 atom % or more. Further, a nitrogen content of the upper layer 22 (average of the entirety of the upper layer 22 including the surface oxidization layer) is preferably 54 atom % or less, and more preferably 50 atom % or less.

The lower layer 21 is preferably formed in contact with a surface of the transparent substrate 1. This is because a configuration where the lower layer 21 contacts the surface of the transparent substrate 1 can obtain greater effect of enhancing a back surface reflectance that is generated by the stacked structure of the lower layer 21 and the upper layer 22 of the phase shift film 2. If only slight influence is given on the effect of enhancing a back surface reflectance of the phase shift film 2, an etching stopper film can be provided between the transparent substrate 1 and the phase shift film 2. In this case, a thickness of the etching stopper film should be 10 nm or less, preferably 7 nm or less, and more preferably 5 nm or less. Further, on the viewpoint of effectively functioning as an etching stopper, a thickness of the etching stopper film should be 3 nm or more. An extinction coefficient k of a material forming the etching stopper film should be less than 0.1, preferably 0.05 or less, and more preferably 0.01 or less. Further, a refractive index n of the material forming the etching stopper film in this case should be at least 2.4 or less, and preferably 2.1 or less. A refractive index n of a material forming the etching stopper film is preferably 1.5 or more.

Ratio[%] where metal content[atom %] in the material forming the lower layer 21 and the upper layer 22 is divided by total content[atom %] of metal and silicon (this ratio is hereafter referred to as "M/[M+Si] ratio") is preferably 1% or more, more preferably 2% or more, and even more preferably 3% or more. On the other hand, M/[M+Si] ratio of the material forming the lower layer 21 and the upper layer 22 is preferably 33% or less, more preferably 30% or less, and even more preferably 25% or less.

It is preferable that the material forming the lower layer 21 and the material forming the upper layer 22 both include the same metal elements in the case of including metal elements. The upper layer 22 and the lower layer 21 are patterned by dry etching using the same etching gas. Therefore, the upper layer 22 and the lower layer 21 are preferably etched in the same etching chamber. When the metal elements included in each material forming the upper layer 22 and the lower layer 21 are the same, environmental change in the etching chamber can be reduced when the object to be dry-etched changes from the upper layer 22 to the lower layer 21.

While the lower layer 21 and the upper layer 22 of the phase shift film 2 are formed through sputtering, any sputtering including DC sputtering, RF sputtering, ion beam sputtering, etc. is applicable. Application of DC sputtering is preferable, considering film forming rate. In the case where the target has low conductivity, while application of RF sputtering and ion beam sputtering is preferable, application of RF sputtering is more preferable considering the film forming rate.

On the other hand, the phase shift film 2 can be configured to include another layer on the upper layer 22. The other layer can be an uppermost layer consisting of a material containing silicon and oxygen, for example. By providing the uppermost layer on the phase shift film 2, durability of the phase shift film 2 to dry etching performed in removing the light shielding film 3 can be enhanced. On the viewpoint of etching durability, the uppermost layer preferably contains a total of silicon and oxygen of 80 atom % or more, more preferably 90 atom %, and even more preferably 95 atom % or more. Due to slight contribution to reducing a transmittance of the phase shift film 2, a thickness of the uppermost layer is preferably 10 nm or less, and more preferably 5 nm or less. On the other hand, on the viewpoint of etching durability, a thickness of the uppermost layer is preferably 1 nm or more, and more preferably 2 nm or more.

The mask blank 100 has a light shielding film 3 on the phase shift film 2. Generally, in a binary transfer mask, an outer peripheral region of a region where a transfer pattern is formed (transfer pattern forming region) is desired to ensure an optical density (OD) of a predetermined value or more to prevent a resist film from being affected by an exposure light that transmitted through the outer peripheral region when an exposure transfer was made on the resist film on a semiconductor wafer using an exposure apparatus. This point is similar in the case of a phase shift mask. Generally, the outer peripheral region of a transfer mask including a phase shift mask preferably has OD of 3.0 or more, and at least 2.8 or more is necessary. The phase shift film 2 has a function to transmit an exposure light at a predetermined transmittance, and it is difficult to ensure an optical density of a predetermined value with the phase shift film 2 alone. Therefore, it is necessary to stack the light shielding film 3 on the phase shift film 2 to ensure lacking optical density at the stage of manufacturing the mask blank 100. With such a configuration of the mask blank 100, the phase shift mask 200 ensuring a predetermined value of optical density on the outer peripheral region can be manufactured by removing the region using the phase shifting effect (basically transfer pattern forming region) of the light shielding film 3 during manufacture of the phase shift mask 200 (see FIGS. 2A-2G).

A single layer structure and a stacked structure of two or more layers are applicable to the light shielding film 3. Further, each layer in the light shielding film 3 of a single layer structure and the light shielding film 3 with a stacked structure of two or more layers may be configured by approximately the same composition in the thickness direction of the layer or the film, or with a composition gradient in the thickness direction of the layer.

The mask blank 100 of the embodiment shown in FIG. 1 is configured by stacking the light shielding film 3 on the phase shift film 2 without an intervening film. For the light shielding film 3 of this configuration, it is necessary to apply a material having a sufficient etching selectivity to etching gas used in forming a pattern in the phase shift film 2. The light shielding film 3 in this case is preferably formed of a material containing chromium. Materials containing chromium for forming the light shielding film 3 can include, in addition to chromium metal, a material containing chromium and one or more elements selected from oxygen, nitrogen, carbon, boron, and fluorine. While a chromium-based material is generally etched by mixed gas of chlorine-based gas and oxygen gas, etching rate of the chromium metal to the etching gas is not as high. Considering enhancing etching rate of the mixed gas of chlorine-based gas and oxygen gas to etching gas, the material forming the light shielding film 3 preferably includes chromium and one or more elements selected from oxygen, nitrogen, carbon, boron, and fluorine. Further, one or more elements among molybdenum, indium, and tin can be included in the material containing chromium for forming the light shielding film 3. Including one or more elements among molybdenum, indium, and tin can increase an etching rate to mixed gas of chlorine-based gas and oxygen gas.

On the other hand, this disclosure includes, as a mask blank 100 of another embodiment, a configuration including another film (etching stopper film) between the phase shift film 2 and the light shielding film 3. In this case, a preferable configuration is that the etching stopper film is formed of the material containing chromium given above, and the light shielding film 3 is formed of a material containing silicon or a material containing tantalum.

A material containing silicon for forming the light shielding film 3 can include a transition metal, and can include metal elements other than the transition metal. The reason is that when a transition metal is included in the light shielding film 3, light shielding performance is significantly improved compared to the case without the transition metal, and a thickness of the light shielding film 3 can be reduced. The transition metal to be included in the light shielding film 3 includes one metal among molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), zinc (Zn), niobium (Nb), palladium (Pd), etc., or an alloy of these metals. Metal elements other than the transition metal elements to be included in the light shielding film 3 include aluminum (Al), indium (In), tin (Sn), gallium (Ga), etc.

In the mask blank 100, a preferable configuration is that the light shielding film 3 has further stacked thereon a hard mask film 4 formed of a material having an etching selectivity to etching gas used in etching the light shielding film 3. Since the light shielding film 3 must have a function to ensure a predetermined optical density, there is a limitation to reduce its thickness. A film thickness of the hard mask film 4 is sufficient if the film thickness functions as an etching mask until the completion of dry etching for forming a pattern in the light shielding film 3 immediately below the hard mask film 4, and basically is not limited with regard to optical density. Therefore, a thickness of the hard mask film 4 can be reduced significantly compared to a thickness of the light shielding film 3. Since a film thickness of a resist film of an organic material is sufficient if the film thickness functions as an etching mask until dry etching for forming a pattern in the hard mask film 4 is completed, a thickness can be reduced significantly compared to conventional resist films. Reduction of film thickness of a resist film is effective for enhancing resist resolution and preventing collapse of pattern, which is extremely important in facing requirements for miniaturization.

In the case where the light shielding film 3 is formed of a material containing chromium, the hard mask film 4 is preferably formed of the material containing silicon given above. Since the hard mask film 4 in this case tends to have low adhesiveness with a resist film of an organic material, it is preferable to treat a surface of the hard mask film 4 with HMDS (Hexamethyldisilazane) to enhance surface adhesiveness. The hard mask film 4 in this case is more preferably made of $SiO_2$, SiN, SiON, etc.

Further, in the case where the light shielding film 3 is formed of a material containing chromium, materials containing tantalum are also applicable as the materials of the hard mask film 4, in addition to the materials given above. The material containing tantalum in this case includes, in addition to tantalum metal, a material containing tantalum and one or more elements selected from nitrogen, oxygen, boron, carbon, and silicon, for example, Ta, TaN, TaO, TaON, TaBN, TaBO, TaBON, TaCN, TaCO, TaCON, TaBCN, TaBOCN, TaSi, TaSiN, TaSiO, TaSiON, TaSiBN, TaSiBO, TaSiBON, TaSiC, TaSiCN, TaSiCO, TaSiCON, etc. Further, in the case where the light shielding film 3 is formed of a material containing silicon, the hard mask film 4 is preferably formed of the material containing chromium given above.

In the mask blank 100, a resist film of an organic-based material is preferably formed in contact with a surface of the hard mask film 4.

The phase shift mask 200 of this embodiment is featured in that a transfer pattern (phase shift pattern) is formed in the phase shift film 2 of the mask blank 100, and a light shielding band pattern is formed in the light shielding film 3. In the case of a configuration where the hard mask film 4 is provided on the mask blank 100, the hard mask film 4 is removed during manufacture of the phase shift mask 200.

The method of manufacturing the phase shift mask 200 of this disclosure uses the mask blank 100 mentioned above, which is featured in including the steps of forming a transfer pattern in the light shielding film 3 by dry etching; forming a transfer pattern in the phase shift film 2 by dry etching with the light shielding film 3 including the transfer pattern as a mask; and forming a light shielding pattern in the light shielding film 3 by dry etching with a resist film 6b including a light shielding band pattern as a mask. The method of manufacturing the phase shift mask 200 of this disclosure is explained below according to the manufacturing steps shown in FIGS. 2A-2G. Explained herein is the method of manufacturing the phase shift mask 200 using the mask blank 100 having the hard mask film 4 stacked on the light shielding film 3. Further, a material containing chromium is applied to the light shielding film 3, and a material containing silicon is applied to the hard mask film 4.

First, a resist film is formed in contact with the hard mask film 4 of the mask blank 100 by spin coating. Next, a first pattern, which is a transfer pattern (phase shift pattern) to be formed in the phase shift film 2, was exposed and written with an electron beam in the resist film, and a predetermined treatment such as developing was conducted, to thereby form a first resist pattern 5a having a phase shift pattern (see FIG. 2A). Subsequently, dry etching was conducted using fluorine-based gas with the first resist pattern 5a as a mask, and a first pattern (hard mask pattern 4a) was formed in the hard mask film 4 (see FIG. 2B).

Figure 2A:
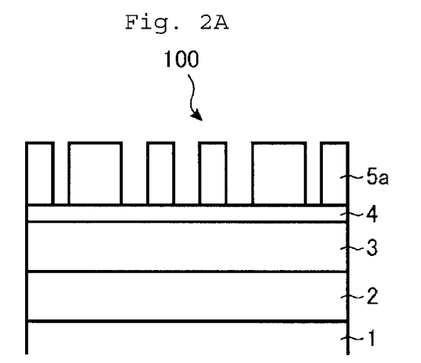
FIGS. 2A-2G are schematic cross-sectional views showing a manufacturing process of the phase shift mask of the embodiment of this disclosure.
Figure 2B:
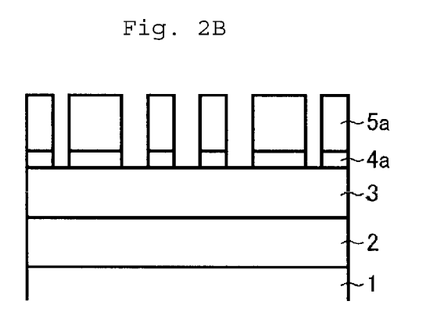
Figure 2C:
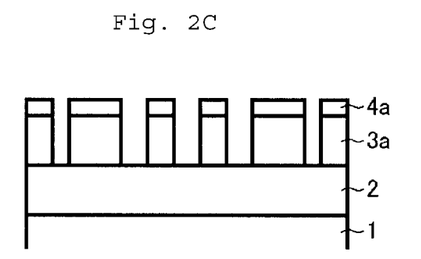
Figure 2D:
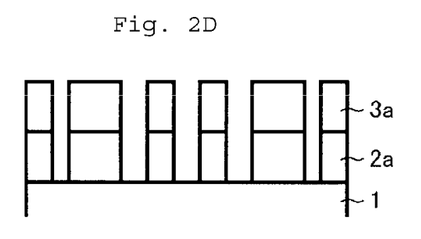
Figure 2E:
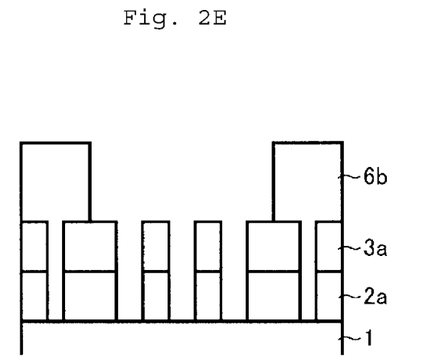

Next, after removing the resist pattern 5a, dry etching was conducted using a mixed gas of chlorine-based gas and oxygen gas with the hard mask pattern 4a as a mask, and a first pattern (light shielding pattern 3a) was formed in the light shielding film 3 (see FIG. 2C). Subsequently, dry etching was conducted using fluorine-based gas with the light shielding pattern 3a as a mask, and a first pattern (phase shift pattern 2a) was formed in the phase shift film 2, and at the same time the hard mask pattern 4a was removed (see FIG. 2D).

Next, a resist film was formed on the mask blank 100 by spin coating. Next, a second pattern, which is a pattern (light shielding band pattern) to be formed in the light shielding film 3, was exposed and written with an electron beam in the resist film, and predetermined treatments such as developing were conducted, to thereby form a second resist pattern 6b having a light shielding pattern (see FIG. 2E). Subsequently, dry etching was conducted using mixed gas of chlorine-based gas and oxygen gas with the second resist pattern 6b as a mask, and a second pattern (light shielding pattern 3b) was formed in the light shielding film 3 (see FIG. 2F). Further, the second resist pattern 6b was removed, predetermined treatments such as cleaning were carried out, and the phase shift mask 200 was obtained (see FIG. 2G).

There is no particular limitation to chlorine-based gas to be used for the dry etching described above, as long as Cl is included. The chlorine-based gas includes, for example, $Cl_2$, $SiCl_2$, $CHCl_3$, $CH_2Cl_2$, $CCl_4$, and $BCl_3$. Further, there is no particular limitation to fluorine-based gas to be used for the dry etching described above, as long as F is included. The fluorine-based gas includes, for example, $CHF_3$, $CF_4$, $C_2F_6$, $C_4F_8$, and $SF_6$. Particularly, fluorine-based gas free of C can further reduce damage on a glass substrate for having a relatively low etching rate to a glass substrate.

The phase shift mask 200 of this disclosure is manufactured using the mask blank 100 mentioned above. Therefore, the phase shift film 2 having a transfer pattern formed therein (phase shift pattern 2a) has a transmittance of 2% or more to a KrF exposure light, and a phase difference between an exposure light transmitted through the phase shift pattern 2a and the exposure light that transmitted through the air for the same distance as the thickness of the phase shift pattern 2a of within the range of 150 degrees or more and 210 degrees or less. Namely, the phase shift pattern 2a has a structure where a lower layer 21 and an upper layer 22 are stacked in order from a side of the transparent substrate 1, in which a refractive index $n_L$ of the lower layer 21 at a wavelength of an exposure light and a refractive index $n_U$ of the upper layer 22 at a wavelength of an exposure light satisfy a relation of $n_L > n_U$, in which an extinction coefficient $k_L$ of the lower layer 21 at a wavelength of an exposure light and an extinction coefficient $k_U$ of the upper layer 22 at a wavelength of an exposure light satisfy a relation of $k_L > k_U$; and in which a thickness $d_L$ of the lower layer 21 and a thickness $d_U$ of the upper layer 22 satisfy a relation of $d_L < d_U$.

The phase shift mask 200 of this disclosure has a back surface reflectance of the phase shift pattern 2a to a KrF exposure light of at least 20% or more, and can suppress thermal expansion of the phase shift pattern 2a caused by irradiation of a KrF exposure light and displacement of the phase shift pattern 2a according to the thermal expansion.

The method of manufacturing the semiconductor device of this disclosure is featured in using the aforementioned phase shift mask 200 or a phase shift mask 200 manufactured using the mask blank 100 given above, and subjecting a resist film on a semiconductor substrate to exposure-transfer of a pattern. Therefore, a desired pattern can be transferred to an object to be transferred (resist film on semiconductor wafer, etc.) at a high precision, even if the phase shift mask 200 is set on an exposure apparatus and a KrF exposure light is irradiated from the side of the transparent substrate 1 of the phase shift mask 200 to perform the exposure-transfer on the object to be transferred.

EXAMPLE

The embodiment of this disclosure is described in greater detail below together with examples.

Example 1

[Manufacture of Mask Blank]

A transparent substrate 1 formed of a synthetic quartz glass with a size of a main surface of about 152 mm×about 152 mm and a thickness of about 6.35 mm was prepared. End surfaces and the main surfaces of the transparent substrate 1 were polished to a predetermined surface roughness, and thereafter subjected to predetermined cleaning treatment and drying treatment. The optical properties of the transparent substrate 1 were measured, and a refractive index $n_S$ was 1.51 and an extinction coefficient $k_S$ was 0.00.

Next, the transparent substrate 1 was placed in a single-wafer DC sputtering apparatus and a lower layer 21 of a phase shift film 2 consisting of molybdenum, silicon, and nitrogen (MoSiN film) was formed. Concretely, by reactive sputtering (DC sputtering) using a mix target of molybdenum (Mo) and silicon (Si) (Mo:Si=9 atom %:91 atom %) with mixed gas of argon (Ar) and nitrogen ($N_2$) (flow rate ratio Ar:$N_2$=2:1) as sputtering gas, the lower layer 21 was formed at a thickness $d_L$ of 9 nm.

Next, the transparent substrate 1 with the lower layer 21 formed thereon was placed in a single-wafer DC sputtering apparatus, and an upper layer 22 of the phase shift film 2 consisting of molybdenum, silicon, and nitrogen (MoSiN film) was formed on the lower layer 21. Concretely, by reactive sputtering (DC sputtering) using a mix target of molybdenum (Mo) and silicon (Si) (Mo:Si=9 atom %:91 atom %) with mixed gas of argon (Ar), nitrogen ($N_2$), and helium (He) (flow rate ratio Ar:$N_2$:He=1:9:8) as sputtering gas, the upper layer 22 was formed at a thickness $d_U$ of 91 nm. The flow rate ratio of nitrogen gas of the sputtering gas used in forming the upper layer 22 is more than the flow rate ratio of the sputtering gas used in forming the lower layer 21. Thus, a nitrogen content of the upper layer 22 is greater than a nitrogen content of the lower layer 21. By the above procedure, the phase shift film 2 having the lower layer 21 and the upper layer 22 stacked in contact with the surface of the transparent substrate 1 was formed at a thickness of 100 nm.

Next, the transparent substrate 1 having the phase shift film 2 formed thereon was subjected to heat treatment for reducing film stress of the phase shift film 2 and for forming an oxidization layer on the surface layer. Concretely, the heat treatment was carried out using a heating furnace (electric furnace) at a heating temperature of 450° C. in the atmosphere for one hour. Another transparent substrate 1 was prepared, with its main surface provided with a phase shift film 2 with a lower layer 21 and an upper layer 22 stacked under the same conditions, and which was subjected to heat treatment. A transmittance and a phase difference of the phase shift film 2 to a light of 248 nm wavelength were measured using a phase shift measurement apparatus (MPM248 manufactured by Lasertec), and a transmittance was 5.3% and a phase difference was 179.1 degrees. Further, the phase shift film 2 was inspected by STEM and EDX, and formation of an oxidization layer was confirmed, at a thickness of about 1.7 nm from the surface of the upper layer 22 of the phase shift film 2. Moreover, optical properties were measured for each of the lower layer 21 and the upper layer 22 of the phase shift film 2, and the lower layer 21 had a refractive index $n_L$ of 2.499 and an extinction coefficient $k_L$ of 2.587, and the upper layer 22 had a refractive index $n_U$ of 2.343 and an extinction coefficient $k_U$ of 0.315, where the difference between a refractive index $n_L$ and a refractive index $n_U$ was 1.0 or less, and the difference between an extinction coefficient $k_L$ and an extinction coefficient $k_U$ was 2.5 or less. Further, a back surface reflectance (reflectance at transparent substrate 1 side) of the phase shift film 2 was 33%.

Next, the transparent substrate 1 having the phase shift film 2 formed thereon was placed in a single-wafer DC sputtering apparatus and a lowermost layer of a light shielding film 3 consisting of CrOCN was formed on the phase shift film 2. Concretely, by reactive sputtering (DC sputtering) using a chromium (Cr) target, with mixed gas of argon (Ar), carbon dioxide ($CO_2$), nitrogen ($N_2$), and helium (He) (flow rate ratio Ar:$CO_2$:$N_2$:He=22:39:6:33) as sputtering gas, a lowermost layer of the light shielding film 3 consisting of CrOCN was formed on the phase shift film 2 at a thickness of 30 nm.

Next, by reactive sputtering (DC sputtering) using the same chromium (Cr) target with mixed gas of argon (Ar) and nitrogen ($N_2$) (flow rate ratio Ar:$N_2$=83:17) as sputtering gas, a lower layer of the light shielding film 3 consisting of CrN was formed on the lowermost layer of the light shielding film 3 at a thickness of 10 nm.

Next, by reactive sputtering (DC sputtering) using the same chromium (Cr) target, with mixed gas of argon (Ar), carbon dioxide ($CO_2$), nitrogen ($N_2$), and helium (He) (flow rate ratio Ar:$CO_2$:$N_2$:He=21:37:11:31) as sputtering gas, an upper layer of the light shielding film 3 consisting of CrOCN was formed on the lower layer of the light shielding film 3 at a thickness of 14 nm. Through the above procedures, a light shielding film 3 of a chromium-based material of a three-layer structure of the lowermost layer consisting of CrOCN, the lower layer consisting of CrN, and the upper layer consisting of CrOCN from the phase shift film 2 side was formed with a total film thickness of 54 nm. The optical density (OD) to a light of 248 nm wavelength of the stacked structure of the phase shift film 2 and the light shielding film 3 was 3.0 or more.

Further, the transparent substrate 1 with the phase shift film 2 and the light shielding film 3 stacked thereon was placed in a single-wafer RF sputtering apparatus, and a hard mask film 4 consisting of silicon and oxygen was formed. Concretely, using silicon dioxide ($SiO_2$) target and by RF sputtering with argon (Ar) gas as sputtering gas, a hard mask film 4 was formed on the light shielding film 3 at a thickness of 5 nm. Through the above procedure, the mask blank 100 having a structure where the phase shift film 2 of a two-layer structure, the light shielding film 3, and the hard mask film 4 are stacked on the transparent substrate 1 was manufactured.

[Manufacture of Phase Shift Mask]

Next, a phase shift mask 200 of Example 1 was manufactured through the following procedure using the mask blank 100 of Example 1. First, a surface of the hard mask film 4 was subjected to HMDS treatment. Subsequently, a resist film of a chemically amplified resist for electron beam writing was formed in contact with a surface of the hard mask film 4 by spin coating at a film thickness of 150 nm. Next, a first pattern, which is a phase shift pattern to be formed in the phase shift film 2, was written by an electron beam in the resist film, predetermined developing and cleaning treatments were conducted, and a first resist pattern 5a having the first pattern was formed (see FIG. 2A).

Next, dry etching using $CF_4$ gas was conducted with the first resist pattern 5a as a mask, and a first pattern (hard mask pattern 4a) was formed in the hard mask film 4 (see FIG. 2B).

Next, the first resist pattern 5a was removed. Subsequently, dry etching was conducted using mixed gas of chlorine and oxygen (gas flow rate ratio $Cl_2:O_2=4:1$) with the hard mask pattern 4a as a mask, and a first pattern (light shielding pattern 3a) was formed in the light shielding film 3 (see FIG. 2C). Next, dry etching was conducted using fluorine-based gas ($SF_6$+He) with the light shielding pattern 3a as a mask, and a first pattern (phase shift pattern 2a) was formed in the phase shift film 2, and at the same time the hard mask pattern 4a was removed (see FIG. 2D).

Figure 2F:
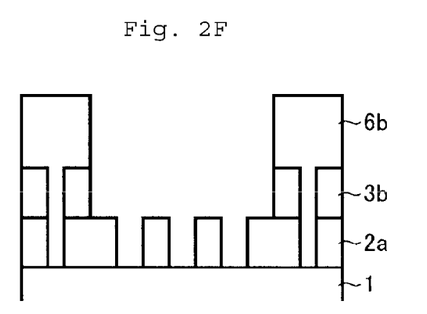
Figure 2G:
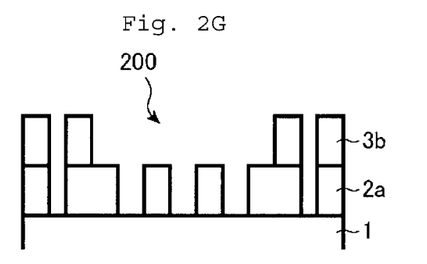

Next, a resist film of a chemically amplified resist for electron beam writing was formed on the light shielding pattern 3a by spin coating at a film thickness of 150 nm. Next, a second pattern, which is a pattern (light shielding band pattern) to be formed in the light shielding film, was exposed and written in the resist film, further subjected to predetermined treatments such as developing, and a second resist pattern 6b having a light shielding pattern was formed (see FIG. 2E). Subsequently, dry etching was conducted using mixed gas of chlorine and oxygen (gas flow rate ratio $Cl_2:O_2=4:1$) with the second resist pattern 6b as a mask, and a second pattern (light shielding pattern 3b) was formed in the light shielding film 3 (FIG. 2F). Further, the second resist pattern 6b was removed, predetermined treatments such as cleaning were carried out, and the phase shift mask 200 was obtained (see FIG. 2G).

The manufactured half tone phase shift mask 200 of Example 1 was set on a mask stage of an exposure apparatus using a KrF excimer laser as an exposure light, a KrF exposure light was irradiated from the transparent substrate 1 side of the phase shift mask 200, and a pattern was exposure-transferred in a resist film on a semiconductor device. The resist film after the exposure transfer was subjected to predetermined treatments to form a resist pattern, and the resist pattern was observed using an SEM (Scanning Electron Microscope). As a result, the amount of in-plane position displacement from the design pattern was within a tolerable range. From the above result, it can be considered that a circuit pattern can be formed at high precision in a semiconductor device with the resist pattern as a mask.

Example 2

[Manufacture of Mask Blank]

A mask blank 100 of Example 2 was manufactured through the same procedure as Example 1, except for the phase shift film 2. The changes made in the phase shift film 2 of Example 2 are the material forming the lower layer 21 and the upper layer 22, and each of their film thicknesses. Concretely, a transparent substrate 1 was placed in a single-wafer DC sputtering apparatus, and a lower layer 21 of the phase shift film 2 formed of molybdenum, silicon, and nitrogen (MoSiN film) was formed on the transparent substrate 1. By reactive sputtering (DC sputtering) using a mix target of molybdenum (Mo) and silicon (Si) (Mo:Si=9 atom %:91 atom %) with mixed gas of argon (Ar) and nitrogen ($N_2$) (flow rate ratio Ar:$N_2$=1:1) as sputtering gas, the lower layer 21 was formed at a thickness $d_L$ of 18 nm.

Next, the transparent substrate 1 with the lower layer 21 formed thereon was placed in a single-wafer DC sputtering apparatus, and an upper layer 22 of the phase shift film 2 consisting of molybdenum, silicon, and nitrogen (MoSiN film) was formed on the lower layer 21. By reactive sputtering (DC sputtering) using a mix target of molybdenum (Mo) and silicon (Si) (Mo:Si=9 atom %:91 atom %) with mixed gas of argon (Ar), nitrogen ($N_2$), and helium (He) (flow rate ratio Ar:$N_2$:He=1:9:8) as sputtering gas, the upper layer 22 was formed at a thickness $d_U$ of 77 nm. The flow rate ratio of nitrogen gas of the sputtering gas used in forming the upper layer 22 is more than the nitrogen gas flow rate ratio of the sputtering gas used in forming the lower layer 21. Thus, a nitrogen content of the upper layer 22 is greater than a nitrogen content of the lower layer 21. By the above procedure, the phase shift film 2 having the lower layer 21 and the upper layer 22 stacked in contact with the surface of the transparent substrate 1 was formed at a thickness of 95 nm.

Further, the phase shift film 2 of Example 2 was also subjected to heat treatment under the same treatment conditions as Example 1. Another transparent substrate 1 was prepared, with its main surface provided with the phase shift film 2 of Example 2 under the same conditions, and which was subjected to heat treatment. A transmittance and a phase difference of the phase shift film 2 to a light of 248 nm wavelength were measured using a phase shift measurement apparatus (MPM248 manufactured by Lasertec), and a transmittance was 5.3% and a phase difference was 180.5 degrees. Further, the phase shift film 2 was inspected by STEM and EDX, and formation of an oxidization layer was confirmed at a thickness of about 1.6 nm from the surface of the upper layer 22 of the phase shift film 2. Moreover, the optical properties were measured for each of the lower layer 21 and the upper layer of the phase shift film 2, and the lower layer 21 had a refractive index $n_L$ of 2.712 and an extinction coefficient $k_L$ of 1.758, and the upper layer 22 had a refractive index $n_U$ of 2.347 and an extinction coefficient $k_U$ of 0.306. Further, a back surface reflectance (reflectance at transparent substrate 1 side) of the phase shift film 2 was 29%, a difference between a refractive index $n_L$ and a refractive index $n_U$ was 1.0 or less, and a difference between an extinction coefficient $k_L$ and an extinction coefficient $k_U$ was 2.5 or less.

Through the above procedures, a mask blank of Example 2 was manufactured, which has a structure where the phase shift film 2 consisting of the lower layer 21 of MoSiN and the upper layer 22 of MoSiN, the light shielding film 3, and the hard mask film 4 are stacked on the transparent substrate 1.

[Manufacture of Phase Shift Mask]

Next, a phase shift mask 200 of Example 2 was manufactured through the same procedure as Example 1 using the mask blank 100 of Example 2.

The manufactured half tone phase shift mask 200 of Example 2 was set on a mask stage of an exposure apparatus using a KrF excimer laser as an exposure light, a KrF exposure light was irradiated from the transparent substrate 1 side of the phase shift mask 200, and a pattern was exposure-transferred in a resist film on a semiconductor device. The resist film after the exposure transfer was subjected to predetermined treatments to form a resist pattern, and the resist pattern was observed using an SEM (Scanning Electron Microscope). As a result, the amount of in-plane position displacement from the design pattern was within a tolerable range. From the above result, it can be considered that a circuit pattern can be formed at high precision in a semiconductor device with the resist pattern as a mask.

Example 3

[Manufacture of Mask Blank]

A mask blank 100 of Example 3 was manufactured through the same procedure as Example 1, except for the phase shift film 2. The changes made in the phase shift film 2 of Example 3 are the materials forming the lower layer 21 and the upper layer 22, and each of their film thicknesses. Concretely, the transparent substrate 1 was placed in a single-wafer RF sputtering apparatus, and a lower layer 21 of a phase shift film 2 consisting of silicon and nitrogen (SiN film) was formed on the transparent substrate 1. By reactive sputtering (RF sputtering) using a silicon (Si) target with mixed gas of krypton (Kr), nitrogen ($N_2$), and helium (He) (flow rate ratio $Kr:N_2:He=5:1:20$) as sputtering gas, the lower layer 21 was formed at a thickness $d_L$ of 29 nm.

Next, the transparent substrate 1 with the lower layer 21 formed thereon was placed in a single-wafer RF sputtering apparatus, and an upper layer 22 of the phase shift film 2 consisting of silicon and nitrogen (SiN film) was formed at a thickness $d_U$ of 69 nm. By reactive sputtering (RF sputtering) using a silicon (Si) target with mixed gas of krypton (Kr), nitrogen ($N_2$), and helium (He) (flow rate ratio $Kr:N_2:He=3:4:16$) as sputtering gas, the upper layer 22 was formed at a thickness $d_U$ of 69 nm. The flow rate ratio of nitrogen gas of the sputtering gas used in forming the upper layer 22 is more than the nitrogen gas flow rate ratio of the sputtering gas used in forming the lower layer 21. Thus, a nitrogen content of the upper layer 22 is greater than a nitrogen content of the lower layer 21. By the above procedure, the phase shift film 2 having the lower layer 21 and the upper layer 22 stacked in contact with the surface of the transparent substrate 1 was formed at a thickness of 98 nm.

Further, the phase shift film 2 of Example 3 was subjected to heat treatment under the same treatment conditions as Example 1. Another transparent substrate 1 was prepared, with its main surface provided with the phase shift film 2 of Example 3 under the same conditions, and which was subjected to heat treatment. A transmittance and a phase difference of the phase shift film 2 to a light of 248 nm wavelength were measured using a phase shift measurement apparatus (MPM248 manufactured by Lasertec), and a transmittance was 5.7% and a phase difference was 178 degrees. Further, the phase shift film 2 was inspected by STEM and EDX, and formation of an oxidization layer was confirmed, at a thickness of about 1.3 nm from the surface of the upper layer 22 of the phase shift film 2. Moreover, optical properties were measured for each of the lower layer 21 and the upper layer 22 of the phase shift film 2, and the lower layer 21 had a refractive index $n_L$ of 2.400 and an extinction coefficient $k_L$ of 2.040, and the upper layer 22 had a refractive index $n_U$ of 2.320 and an extinction coefficient $k_U$ of 0.040, where the difference between a refractive index $n_L$ and a refractive index $n_U$ was 1.0 or less, and the difference between an extinction coefficient $k_L$ and an extinction coefficient $k_U$ was 2.5 or less. Further, a back surface reflectance (reflectance at transparent substrate 1 side) of the phase shift film 2 was 30%.

By the above procedure, the mask blank 100 of Example 3 was manufactured, the mask blank 100 having a structure in which the phase shift film 2 including the lower layer 21 of SiN and the upper layer 22 of SiN, the light shielding film 3, and the hard mask film 4 are stacked on the transparent substrate 1.

[Manufacture of Phase Shift Mask]

Next, a phase shift mask 200 of Example 3 was manufactured through the same procedure as Example 1 using the mask blank 100 of Example 3.

The manufactured half tone phase shift mask 200 of Example 3 was set on a mask stage of an exposure apparatus using a KrF excimer laser as an exposure light, a KrF exposure light was irradiated from the transparent substrate 1 side of the phase shift mask 200, and a pattern was exposure-transferred in a resist film on a semiconductor device. The resist film after the exposure transfer was subjected to predetermined treatments to form a resist pattern, and the resist pattern was observed using an SEM (Scanning Electron Microscope). As a result, the amount of in-plane position displacement from the design pattern was within a tolerable range. From the above result, it can be considered that a circuit pattern can be formed at high precision on a semiconductor device with the resist pattern as a mask.

Comparative Example 1

[Manufacture of Mask Blank]

A mask blank of Comparative Example 1 was manufactured by the same procedure as Example 1, except for the phase shift film. A single layer structure film formed of molybdenum, silicon, and nitrogen was applied for the phase shift film of Comparative Example 1. Concretely, a transparent substrate was placed in a single-wafer DC sputtering apparatus, and by reactive sputtering (DC sputtering) using a mix-sintered target of molybdenum (Mo) and silicon (Si) (Mo:Si=21 atom %:79 atom %) and with mixed gas of argon (Ar), nitrogen ($N_2$), and helium (He) (flow rate ratio $Ar:N_2:He=1:9:6$) as sputtering gas, a phase shift film was formed at a thickness of 92 nm.

Further, another transparent substrate was prepared, with its main surface provided with the phase shift film of Comparative Example 1 under the same conditions. A transmittance and a phase difference of the phase shift film to a light of 248 nm wavelength were measured using a phase shift measurement apparatus (MPM248 manufactured by Lasertec), and a transmittance was 5.5% and a phase difference was 177 degrees. Moreover, each optical property of the phase shift film was measured, and a refractive index n was 2.30 and an extinction coefficient k was 0.57.

By the above procedure, a mask blank of Comparative Example 1 was manufactured, the mask blank having a structure where the phase shift film formed of MoSiN, the light shielding film, and the hard mask film are stacked on the transparent substrate.

[Manufacture of Phase Shift Mask]

Next, using the mask blank of Comparative Example 1, a phase shift mask of Comparative Example 1 was manufactured through the same procedure as Example 1.

The manufactured half tone phase shift mask of Comparative Example 1 was set on a mask stage of an exposure apparatus using a KrF excimer laser as an exposure light, a KrF exposure light was irradiated from the transparent substrate 1 side of the phase shift mask, and a pattern was exposure-transferred in a resist film on a semiconductor device. The resist film after the exposure transfer was subjected to predetermined treatments to form a resist pattern, and the resist pattern was observed using an SEM (Scanning Electron Microscope). As a result, the amount of position displacement from the design pattern was significant, and a large number of portions out of tolerable range were found. From this result, generation of short-circuit or disconnection is expected on a circuit pattern to be formed on the semiconductor device using the resist pattern as a mask.

DESCRIPTION OF REFERENCE NUMERALS 1 transparent substrate
2 phase shift film
21 lower layer
22 upper layer
2a phase shift pattern
3 light shielding film
3a, 3b light shielding pattern
4 hard mask film
4a hard mask pattern
5a first resist pattern
6b second resist pattern
100 mask blank
200 phase shift mask

The invention claimed is:

1. A mask blank comprising a phase shift film on a transparent substrate,
wherein a transmittance of the phase shift film with respect to an exposure light of a KrF excimer laser is 2% or more, and
wherein the phase shift film is configured to transmit the exposure light so that transmitted light has a phase difference of 150 degrees or more and 210 degrees or less with respect to the exposure light transmitted through the air for a same distance as a thickness of the phase shift film;
wherein the phase shift film has a structure where a lower layer and an upper layer are stacked in order from a side of the transparent substrate;
wherein a refractive index $n_L$ of the lower layer at a wavelength of the exposure light and a refractive index $n_U$ of the upper layer at a wavelength of the exposure light satisfy a relation of $n_L > n_U$;
wherein an extinction coefficient $k_L$ of the lower layer at a wavelength of the exposure light and an extinction coefficient $k_U$ of the upper layer at a wavelength of the exposure light satisfy a relation of $k_L > k_U$; and
wherein a thickness $d_L$ of the lower layer and a thickness $d_U$ of the upper layer satisfy a relation of $d_L < d_U$.

2. The mask blank according to claim 1, wherein a refractive index $n_U$ of the upper layer is 2.0 or more.

3. The mask blank according to claim 1, wherein a refractive index $n_L$ of the lower layer is 2.2 or more.

4. The mask blank according to claim 1, wherein an extinction coefficient $k_L$ of the lower layer is 1.0 or more.

5. The mask blank according to claim 1, wherein a thickness $d_U$ of the upper layer is two times or more than a thickness $d_L$ of the lower layer.

6. The mask blank according to claim 1, wherein the phase shift film contains silicon and nitrogen.

7. The mask blank according to claim 1, wherein the lower layer is provided in contact with a surface of the transparent substrate.

8. The mask blank according to claim 1, wherein a thickness $d_L$ of the lower layer is 40 nm or less.

9. The mask blank according to claim 1 comprising a light shielding film on the phase shift film.

10. A phase shift mask comprising a phase shift film having a transfer pattern on a transparent substrate,
wherein a transmittance of the phase shift film with respect to an exposure light of a KrF excimer laser is 2% or more, and
wherein the phase shift film is configured to transmit the exposure light so that transmitted light has a phase difference of 150 degrees or more and 210 degrees or less with respect to the exposure light transmitted through the air for a same distance as a thickness of the phase shift film;
wherein the phase shift film has a structure where a lower layer and an upper layer are stacked in order from a side of the transparent substrate;
wherein a refractive index $n_L$ of the lower layer at a wavelength of the exposure light and a refractive index $n_U$ of the upper layer at a wavelength of the exposure light satisfy a relation of $n_L > n_U$;
wherein an extinction coefficient $k_L$ of the lower layer at a wavelength of the exposure light and an extinction coefficient $k_U$ of the upper layer at a wavelength of the exposure light satisfy a relation of $k_L > k_U$; and
wherein a thickness $d_L$ of the lower layer and a thickness $d_U$ of the upper layer satisfy a relation of $d_L < d_U$.

11. The phase shift mask according to claim 10, wherein a refractive index $n_U$ of the upper layer is 2.0 or more.

12. The phase shift mask according to claim 10, wherein a refractive index $n_L$ of the lower layer is 2.2 or more.

13. The phase shift mask according to claim 10, wherein an extinction coefficient $k_L$ of the lower layer is 1.0 or more.

14. The phase shift mask according to claim 10, wherein a thickness $d_U$ of the upper layer is two times or more than a thickness $d_L$ of the lower layer.

15. The phase shift mask according to claim 10, wherein the phase shift film contains silicon and nitrogen.

16. The phase shift mask according to claim 10, wherein the lower layer is provided in contact with a surface of the transparent substrate.

17. The phase shift mask according to claim 10, wherein a thickness $d_L$ of the lower layer is 40 nm or less.

18. The phase shift mask according to claim 10 comprising a light shielding film having a pattern comprising a light shielding band on the phase shift film.

19. A method of manufacturing a semiconductor device comprising the step of using the phase shift mask according to claim 18 and subjecting a resist film on a semiconductor substrate to exposure transfer of the transfer pattern.

* * * * *